United States Patent
Nguyen et al.

(10) Patent No.: US 6,600,338 B1
(45) Date of Patent: Jul. 29, 2003

(54) APPARATUS AND METHOD FOR LEVEL-SHIFTING INPUT RECEIVER CIRCUIT FROM HIGH EXTERNAL VOLTAGE TO LOW INTERNAL SUPPLY VOLTAGE

(75) Inventors: Huy Nguyen, San Jose, CA (US); Roxanne Vu, San Jose, CA (US); Benedict Lau, San Jose, CA (US); Jade Kizer, Mountain View, CA (US)

(73) Assignee: Rambus, Inc., Los Altos, CA (US)

(*) Notice: Subject to any disclaimer, the term of this patent is extended or adjusted under 35 U.S.C. 154(b) by 0 days.

(21) Appl. No.: 09/849,755

(22) Filed: May 4, 2001

(51) Int. Cl.[7] ................. H03K 19/0175; H03K 19/094
(52) U.S. Cl. ......................... 326/68; 326/81; 327/333
(58) Field of Search ...................... 326/68, 80, 81, 326/83; 327/333

(56) References Cited

U.S. PATENT DOCUMENTS

| | | | |
|---|---|---|---|
| 4,782,251 A | * 11/1988 | Tsugaru et al. | 307/475 |
| 5,534,795 A | 7/1996 | Wert et al. | 326/81 |
| 5,534,798 A | 7/1996 | Phillips et al. | 326/108 |
| 5,635,859 A | * 6/1997 | Yokota et al. | 326/67 |
| 5,663,663 A | 9/1997 | Cao et al. | 326/81 |
| 5,751,168 A | 5/1998 | Speed, III et al. | 326/83 |
| 5,757,712 A | 5/1998 | Nagel et al. | 365/226 |
| 5,867,010 A | 2/1999 | Hinedi et al. | 323/282 |
| 5,973,508 A | 10/1999 | Nowak et al. | 326/81 |
| 5,986,472 A | 11/1999 | Hinedi et al. | 326/68 |
| 5,994,921 A | * 11/1999 | Hedberg | 326/81 |
| 6,097,215 A | 8/2000 | Bialas, Jr. et al. | 326/68 |
| 6,160,421 A | 12/2000 | Barna | 326/63 |
| 2001/0011917 A1 | * 8/2001 | Kim et al. | 327/333 |
| 2001/0024137 A1 | * 9/2001 | Miura | 327/333 |

OTHER PUBLICATIONS

"Direct Rambus Clock Generator", Rambus Inc., Document DL–0056, Version 1.2, Nov. 2000, pp. 1–2.
"Application Brief #1", IDT Logic Applications, Integrated Device Technology, Inc., APP–BRF1–00050, 2000, pp. 1–4.
Jim Hagerman, "Two Transistors Form Bidirectional Level Translator", www.ednmag.com/reg/1996/110796/23DI_02.htm, 1996, pp. 1–3.
"The PC Technology Guide", www.pctechguide.com/03memory.htm, Feb. 18, 2001, pp. 1–9.
"System Management Bus (SMBus) Specification Version 2.0", Section 2 General Characteristics, SBS Implementers Forum, Aug. 3, 2000, pp. 9–10.
Kenneth M Cuy, "Design Considerations Bring Unity To A Mixed–Voltage World", www.ednmag.com/ednmag/reg/1995/020295/03df3.htm, Feb. 2, 1995, pp. 1–8.

* cited by examiner

Primary Examiner—Daniel Chang

(57) ABSTRACT

A circuit and method for level-shifting an input signal are disclosed that provide for level-shifting of a the input signal where an external voltage level is greater than an internal voltage of the signal. In the present invention, the input signal is compared to a reference signal to produce a differential current signal reflecting the logic level of the input signal. The differential current signal is reflected through a pair of current mirrors operating from the external voltage level to drive a pair of resistive loads. Each of the resistive loads is coupled in series with a current sink between the internal supply voltage and a ground voltage. As a result, the input signal may be received and level-shifted with gain even when the internal supply voltage is less than twice a transistor threshold voltage without introducing significant distortion to the received signal.

29 Claims, 7 Drawing Sheets

APPARATUS AND METHOD FOR LEVEL-SHIFTING INPUT RECEIVER CIRCUIT FROM HIGH EXTERNAL VOLTAGE TO LOW INTERNAL SUPPLY VOLTAGE

FIELD OF THE INVENTION

This present invention relates to digital interface circuitry. More specifically, it relates to voltage level shifters.

BACKGROUND OF THE INVENTION

As digital circuitry and systems have evolved, they have been designed to utilize steadily lower supply voltage levels. For example, early Transistor-Transistor-Logic (TTL) digital logic circuits typically operated from a 5 volt (V) power supply. As the need for power efficiency has grown, primarily with respect to mobile devices, the typical power supply voltage for devices dropped to 3V and, now, devices designed to operate from 1.8V supply levels dominate the market. Also, as the transistor geometries for integrated circuit technology have dropped, some devices are unable to operate using higher voltage supply levels. Further, lower voltage levels reduce output voltage swings and, consequently, the noise produced by the circuit.

However, many architectural standards, such as bus standards, were developed when a different logical voltage level was the norm. Also, systems may incorporate devices having different supply voltage requirements. For example, a system may include a processor, memory controller and memory that are designed to operate using 1.8V, while the system bus may be designed to operate using 3.3V of have come to operate traditionally. For example, the Peripheral Control Interface (PCI) Local Bus is designed to operate using 5V and 3.3V signaling levels. See the PCI Local Bus Specification version 2.2, herein incorporated in its entirety for all purposes.

FIG. 1 illustrates an example of a system architecture 10 utilizing a PCI local bus 40. A microprocessor 20 directly interfaces to a cache 22 and memory controller 30 via the processor bus. Memory controller 30 also interfaces to a dynamic random access memory (DRAM) device 32 and to PCI local bus 40. The memory controller 30 provides a bridge to the PCI bus from the processor bus and handles access to DRAM 32 and the other devices coupled to PCI local bus 40 for the processor 20. Architecture 10 includes a representative selection of peripheral devices, e.g. network interface 42 for communications with an external network such as a local area network (LAN), graphics interface 44 for driving a video output, peripheral interface 46 for interfacing to other peripheral devices, such as keyboards, modems, etc., and disk controller 50 for controlling bulk storage to disk 52.

Today, processor 20, cache 22, memory controller 30 and DRAM 32 are often designed for use with a 1.8V supply. However, as noted above, the PCI standard currently calls for logic signaling levels based on 3.3V or 5V. This raises the problem of interfacing between devices operating using different supply levels. For example, interfacing the output from a higher voltage device, such as a 5V device, to the input of a lower voltage device, such as a 3.3V device, can forward bias the Electrostatic Discharge (ESD) protection diode typically coupled to the input pad.

Systems may incorporate devices operating from a variety of supply sources having different levels. FIG. 2 is a diagram of a clock generation architecture 60 wherein a system clock source 80 operating from voltage supply $V_{DD}IR$, e.g. 3V, produces a reference clock signal RefCLK that is input to a Direct Rambus Clock Generator (DRCG) circuit operating from another voltage supply $V_{DD}$, e.g. 1.8V, and producing a Bus Clock signal based on another supply voltage $V_{DD}IPD$. The Bus Clock, in turn, drives Rambus DRAMs (RDRAM) 92 and 94, which are controlled by memory controller 90. The Rambus DRCG 70, controller 90, and RDRAMs 92 and 94 operate using the Rambus Signal Level (RSL), wherein a logic '1' is represented by 1.0V and a logic '0' is represented by 1.8V, which is the Rambus supply voltage. See Direct Rambus Clock Generator, Document DL-0056, Version 1.2, Rambus Inc., November 2000, herein incorporated in its entirety for all purposes.

In order to allow an output operating from one voltage level to drive an input operating from a lower voltage level, an input level translator is typically required. FIG. 3 illustrates one example of an input level translator relating to the clock generation architecture 60 of FIG. 2. An output pin of clock source 80 includes an output driver 82 that operates from the supply voltage $V_{DD}IR$, which typically ranges from 1.3V to 3.3V. The output signal from output driver 82 reflects the voltage level of $V_{DD}IR$. The output driver 82 drives an input pin of DRCG 70, which includes an input comparator 72 that operates from supply voltage $V_{DD}IPD$. DRCG 70 also has an input that receives $V_{DD}IR$, which is divided by resistors 74 and 76 to obtain a threshold voltage that is input to comparator 72. Comparator 72 compares the voltage signal received from output driver 82 with the threshold voltage obtained by dividing $V_{DD}IR$ in order to generate a received signal having logic voltage levels that reflect the voltage level $V_{DD}IPD$.

Conventional input level shifters appear in a variety of forms, such as operational amplifier network, resistive divider network, or source follower. FIG. 3 illustrates an example of a combination resistive divider and operation amplifier, where comparator 72 is implemented as an operational amplifier. FIG. 4 illustrates an example of a source follower input circuit 100 composed of transistor 102, input resistor 104 and source resistor 106. In source follower circuit 100, a higher voltage signal received at DIN is reflected at the source of transistor 102, which is coupled to DOUT. The voltage levels appearing at DOUT are determined by the magnitude of supply voltage $V_{DD}I$ coupled to the drain of transistor 102. A variety of conventional level shifter circuits are shown in U.S. Pat. Nos. 6,160,421; 6,097,215; 5,986,472; 5,973,508; 5,867,010; 5,757,712, 5,751,168; 5,663,663; 5,534,798; and 5,534,795, herein incorporated by reference for all purposes.

Conventional level shifters have a limited ability to shift from an external voltage level to an internal voltage level. Source follower circuits are dependent on the threshold voltage Vt of the transistor and tolerate only a narrow range between the external voltage level and the internal supply voltage. (?) Consequently, the source follower circuits must be tuned to each particular application. In addition, source followers do not provide gain for the input signal. In resistive divider circuits, the ratio of the resistors must be selected for the relationship between the external and internal voltage sources for the particular application and, as a result, cannot tolerate much variation in the external supply voltage. Also, the introduction of resistance to the receive path will slow the response of the input circuit making resistive dividers unsuitable for high speed applications.

Operational amplifier based circuits can be configured to introduce gain to the input signal path. However, the gain of the operation amplifier is determined by the ratio of the feedback resistance to the input resistance for the amplifier.

This ratio is fixed and must be designed for a specific ratio of external to internal voltage levels. The resistance also tends to slow the circuit, resulting in poor high speed performance. For a differential input amplifier circuit, transistors must generally be stacked and a low internal voltage supply level, e.g. VDD less than 2Vt, the differential pair of the amplifier will run out of headroom to operate. In other words, the supply voltage level becomes insufficient to accommodate the output swing of the circuit without introducing distortion. For a single-ended input amplifier circuit, the gain offset can become quite large because the current source for the circuit may be pushed into its linear operating region. This causes distortion of the output signal for the receiver, such as duty cycle error. This occurs because there is a higher gain level when the data signal is higher, but lower gain when the reference voltage for the circuit is higher, since the reference voltage is less than the peak amplitude of the data.

FIG. 5 is a waveform diagram illustrating an example of the distortion that can occur due to a lack of operating headroom in a conventional receiver that utilizes a source follower to perform level shifting. In FIG. 5, waveform 110 represents a reference voltage for an input data signal represented by waveform 112. In this example, reference voltage 110 is approximately 1.4V and data signal 112 varies from 1V to 1.8V. Likewise, waveform 114 represents a level shifted reference voltage for a level-shifted data signal 116 that results from the level shifting of data signal 112. Waveform 120 represents the output voltage waveform of a gain stage that results from the input data signal 112 after it has been level shifted and amplified in a circuit having inadequate headroom.

Waveform 120 exhibits distortion due to voltage undershoot (illustrated at 122) and a flattening of the waveform (illustrated at 124) due to lack of headroom in the circuit. Further, waveform 120 exhibits an offset error (illustrated at 126), where the output waveform has become offset in time from the input waveform. Note that the troughs and peaks of waveform 120 are not centered between the vertical time intervals, as are those of waveform 112, but are offset to the right of center. This offset arises because of the time delay through a level-shift or gain stage portion of the input circuit. Further note that the slopes of the rising and falling portions of waveform 120 are different. This difference between the slopes also gives rise to distortion and errors in the output signal.

Thus, the need remains for an input circuit that operates at low supply voltage levels and is also capable of level shifting higher voltage input signals without introducing significant distortion.

SUMMARY OF THE INVENTION

An embodiment of a level-shifting input receiver circuit, according to the present invention, includes a differential amplifier having first and second input terminals, first and second output terminals, and first and second power terminals. The first input terminal of the differential amplifier is configured to receive an input data signal, the second input terminal is configured to receive a reference signal, and the first power terminal is configured to receive a first power supply voltage. The receiver circuit also includes a first current source having a first power terminal coupled to the second power terminal of the differential amplifier, a second power terminal configured to receive a second power supply voltage, and a control terminal configured to receive a bias control signal. The differential amplifier drives a first load having a first terminal configured to receive a third power supply voltage and a second terminal coupled to the first output terminal of the differential amplifier. Further included is a second current source having a first power terminal coupled to the first output terminal of the differential amplifier, a second power terminal configured to receive the second power supply voltage, and a control terminal configured to receive the bias control signal. Also provided is a second load having a first terminal configured to receive the third power supply voltage and a second terminal coupled to the second output terminal of the differential amplifier. Finally, there is a third current source having a first power terminal coupled to the second output terminal of the differential amplifier, a second power terminal configured to receive the second power supply voltage, and a control terminal configured to receive the bias control signal. A further refinement of this embodiment of a receiver circuit includes a first clamp circuit configured to shunt current between the first output terminal of the differential amplifier and the second power supply voltage and a second clamp circuit configured to shunt current between the second output terminal of the differential amplifier and the second power supply voltage.

An embodiment of a method for level-shifting a received signal, according to the present invention, calls for receiving an input signal having logic levels related to an external power supply voltage, receiving a reference voltage configured to differentiate between the logic levels of the received input signal, and differentially comparing the received input signal and the received reference voltage to generate a differential current signal, where the differential current signal is sourced from the external power supply voltage. The method further recites coupling a resistive load in series with a pulling current source between an internal power supply voltage and a ground supply voltage and driving the resistive load with the differential current signal. A further refinement of this embodiment of the present invention calls for clamping the differential current signal to the ground supply voltage.

An embodiment of an apparatus for level-shifting a signal, according to the present invention, includes an external power supply terminal, an internal power supply terminal, a ground supply terminal, a data input terminal, a reference input terminal, and a bias input terminal. The apparatus also includes first, second and third current sources, each of the first, second and third current sources having first and second current terminals and a control terminal. Each of the first, second and third current sources is configured to conduct current between the first to the second current terminals under control of a signal received at the control terminal. The second current terminal of each of the first, second and third current sources is coupled to the ground supply terminal. The control terminal of each of the first, second and third current sources is coupled to the bias input terminal. A differential input buffer of the apparatus has a first input node coupled to the data input terminal, a second input node coupled to the reference input terminal, a first power node coupled to the external power supply terminal, a second power node coupled to the first current terminal of the first current source, a first output terminal coupled to the first current terminal of the second current source, and a second output terminal coupled to the first current terminal of the third current source. A first resistive load is coupled between the internal power supply terminal and the first output terminal of the differential input buffer. Finally, a second resistive load is coupled between the internal power supply terminal and the second output terminal of the differential input buffer. A further refinement of this embodiment of an apparatus according to the present invention includes a clamp circuit having a first current terminal coupled to the first output terminal of the differential input buffer and a second current terminal coupled to the second output terminal of the differential input buffer, and a third current terminal coupled to the ground supply terminal, where the clamp circuit is configured to sink current from one of the first and second current terminals of the clamp circuit to the third current terminal of the clamp circuit responsive to the voltage at one of the first and second current terminals of the clamp circuit exceeding a predetermined voltage level.

The foregoing and other features and advantages of the system and method for level-shifting will be more apparent from the following description of embodiments of the system and method as illustrated in the accompanying drawings in which like reference characters refer to the same parts throughout the different views.

BRIEF DESCRIPTION OF THE DRAWINGS

Preferred embodiments of the present inventions are described with reference to the following drawings, wherein.

DETAILED DESCRIPTION OF PREFERRED EMBODIMENTS

The present invention is directed to a system and method for receiving high voltage signals in a low supply voltage circuit where there is low operating headroom. The present invention utilizes an input differential pair to translate input signals from a high voltage supply level ($V_{DD}IO$) into a differential current signal to level shift down to a low internal voltage supply level ($V_{DD}I$).

The present invention utilizes current sources that may be controlled to obtain a high compliance for current draw. For particularly high current matching requirements, a cascade stage may be added to a current mirror to improve accuracy where operating headroom so permits.

In the present invention, "pushing" differential currents may be steered to "pulling" current sources to create a gain stage across a resistive load, which may be implemented as PMOS (P-channel Metal Oxide Semiconductor) transistors. This approach eliminates the need for an additional differential-pair for steering current into the resistive load and permits operation with lower power supply voltage levels. The "pushing" and "pulling" sources may be configured such that the pushing source is slightly smaller than the pulling source in order to prevent voltage at a gain node from being driven beyond the power supply voltage level. Further, clamp circuitry may be provided that further prevents overshoot of the voltage at the gain node beyond the power supply voltage level. The clamp circuitry also protects transistor devices from overstress during power down mode when bias currents are turned off, but the power supply voltage may still be present.

Thus, in one embodiment, the present invention provides efficient level shifting capability between an external voltage level ($V_{DD}IO$) and an internal power supply voltage level ($V_{DD}$) for a circuit. The present invention may also provide a low overhead differential current gain stage. In another embodiment, the present invention includes clamp circuitry for protection of devices internal to the circuit from high external voltages applied to the gates of the internal devices. Further, the present invention reduces single ended input gain offset induced by low power supply operating headroom.

A receiver circuit according to the present invention is able to operate from very low internal power supply voltage levels and eliminates the need for an extra differential-pair gain stage. Also, a receiver circuit, according to the present invention, may be provided that may be fabricated using multiple production techniques and applications where external signal voltages and internal supply voltage may vary greatly and that require an input signal level shifter with a wide operating range. Further, a receiver circuit, according to the present invention, may provide improved receiving signal duty cycle.

Figure 6:
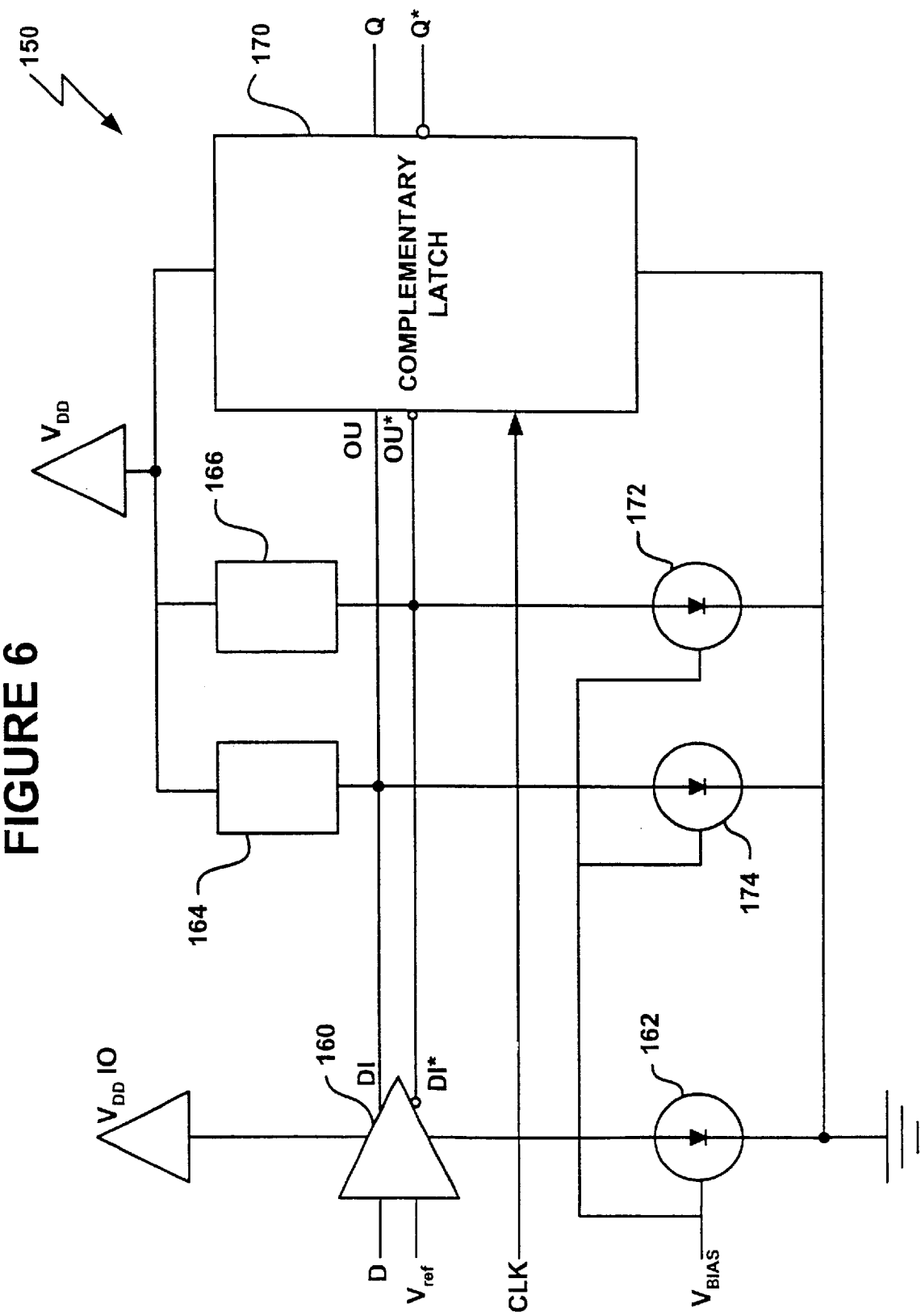
FIG. 6 is a functional block diagram illustrating an embodiment of a level-shifting input receiver circuit, according to the present invention, configured to receive a signal from an output driver circuit operating using a different power supply voltage level and logic voltage level from that of the receiver circuit.

FIG. 6 is a functional block diagram illustrating an embodiment of a receiver circuit 150, according to the present invention. Receiver circuit 150 includes a differential amplifier or buffer 160 that operates from an external voltage supply $V_{DD}IO$. Differential amplifier 160 has an input terminal D for receiving an input data signal and a reference voltage input terminal $V_{ref}$. A current source 162 is coupled in series with differential amplifier 160 between external voltage supply $V_{DD}IO$ and a circuit ground supply, where current source 162 is controlled by a bias control voltage signal $V_{BIAS}$, such that differential amplifier 160 operates using the external voltage supply $V_{DD}IO$. Current source 162 may be configured to operate using either the external voltage supply $V_{DD}IO$ or internal power supply $V_{DD}$.

Receiver circuit 150 also includes a pair of resistive loads 164 and 166 that are coupled in series between an internal power supply $V_{DD}$ and the circuit ground supply with current sources 174 and 172, respectively. Current sources 174 and 172 are also controlled by $V_{BIAS}$. A non-inverted output DI of differential amplifier 160 is coupled between resistive load 164 and current source 174 to form a non-inverted gain node OU. Likewise, an inverted output DI* of differential amplifier 160 is coupled between resistive load 166 and current source 172 to form an inverted gain node OU*. Note that differential amplifier 160 converts the data signal received at input terminal D into a current signal output at output terminals DI and DI* through comparison of the data signal at input terminal D to the reference voltage present at reference voltage input terminal $V_{ref}$.

Also note that the receiver circuit 150 may be adapted to receive a differential data signal. To receive a differential data signal, the reference voltage input terminal $V_{ref}$ is replaced by a complementary input terminal D* that receives a data signal that is the inverted complement of the data signal received at input terminal D. Thus, the outputs DI and DI* of amplifier 160 reflect the relationship between the data input signal and the inverted data input signal rather than the data input signal compared to a reference input voltage.

Non-inverted gain node OU is coupled to a non-inverted input of a complementary latch 170 that operates from internal power supply $V_{DD}$. Also, inverted gain node OU* is coupled to an inverted input of complementary latch 170. An externally supplied clock signal CLK drives a clock input of latch 170 that latches the logic value represented at nodes OU and OU* for output at non-inverted output Q and inverted output Q*.

In receiver 150, a digital signal received at input terminal D has logic voltage levels determined relative to $V_{DD}IO$. The external power supply voltage level. $V_{DD}IO$ may be greater than the internal power supply $V_{DD}$. Thus, the logic voltage levels received at terminal D must be level shifted by receiver circuit 150 for use with the internal circuitry of an integrated circuit, such as complementary latch 170.

Figure 1:
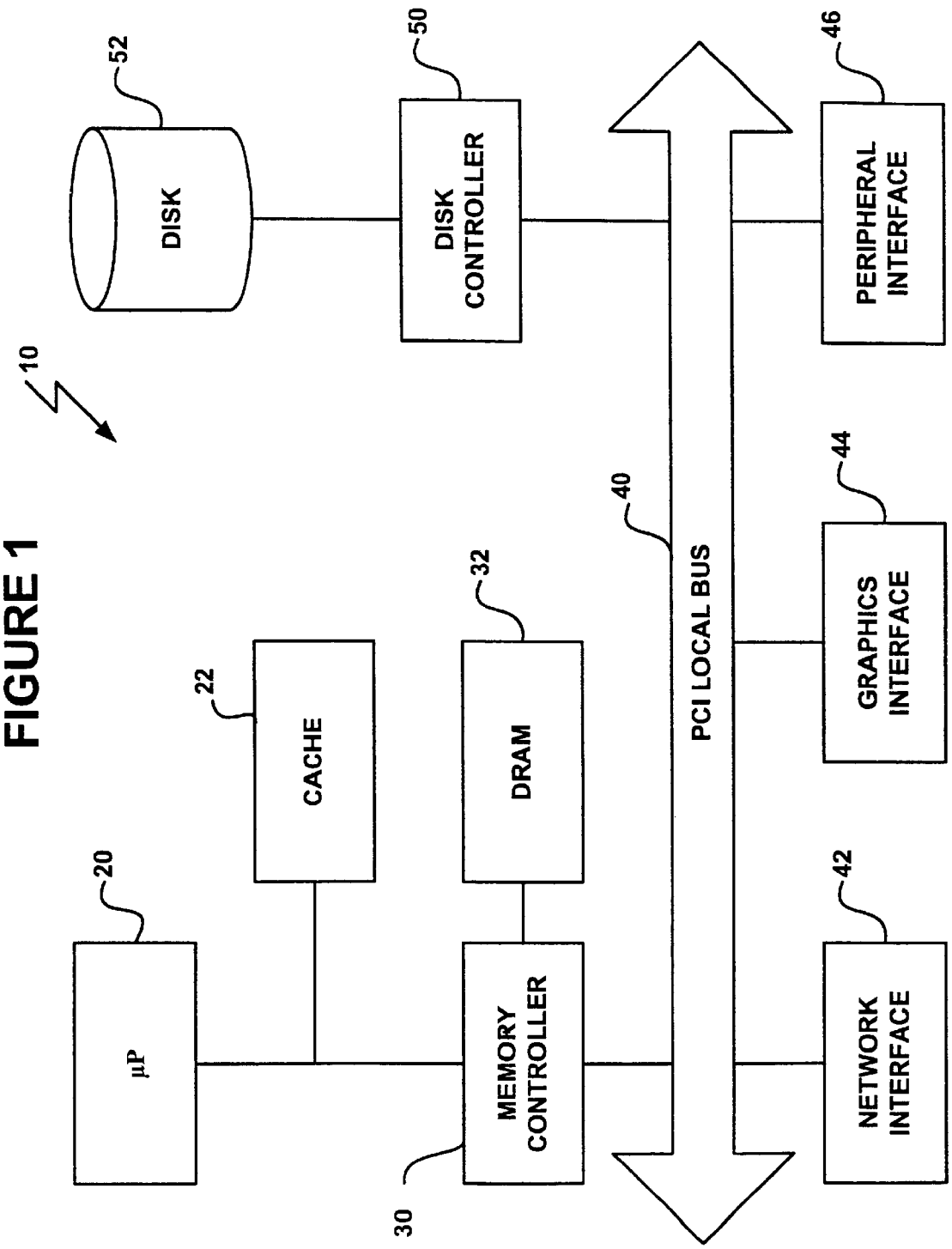
FIG. 1 is a functional block diagram illustrating an example of a system architecture employing devices that may operate with a variety of logic voltage levels and power supply levels.
Figure 2:
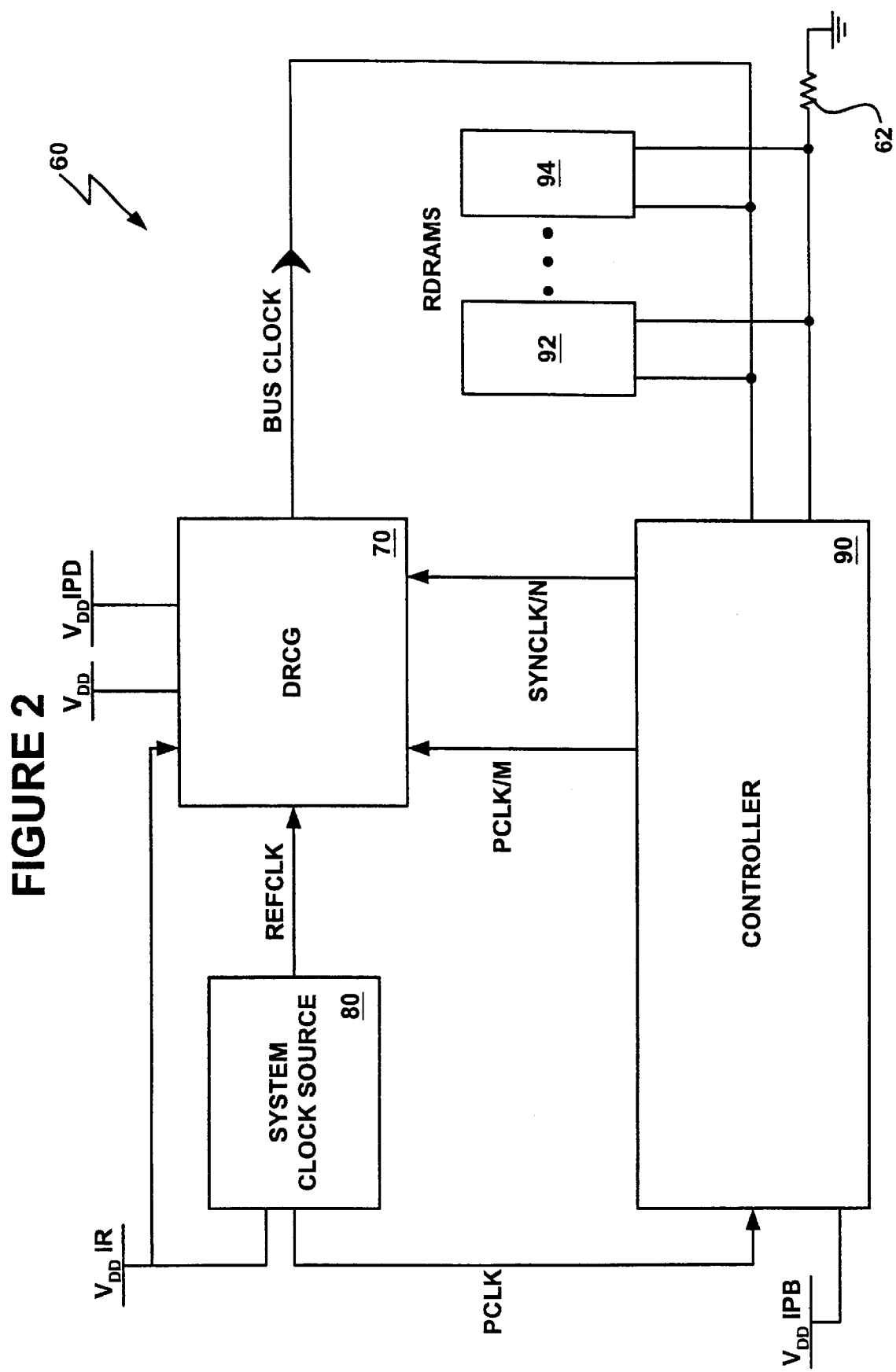
FIG. 2 is a functional block diagram illustrating another example of a system architecture employing devices that may operate with a variety of logic voltage levels and power supply levels.
Figure 3:
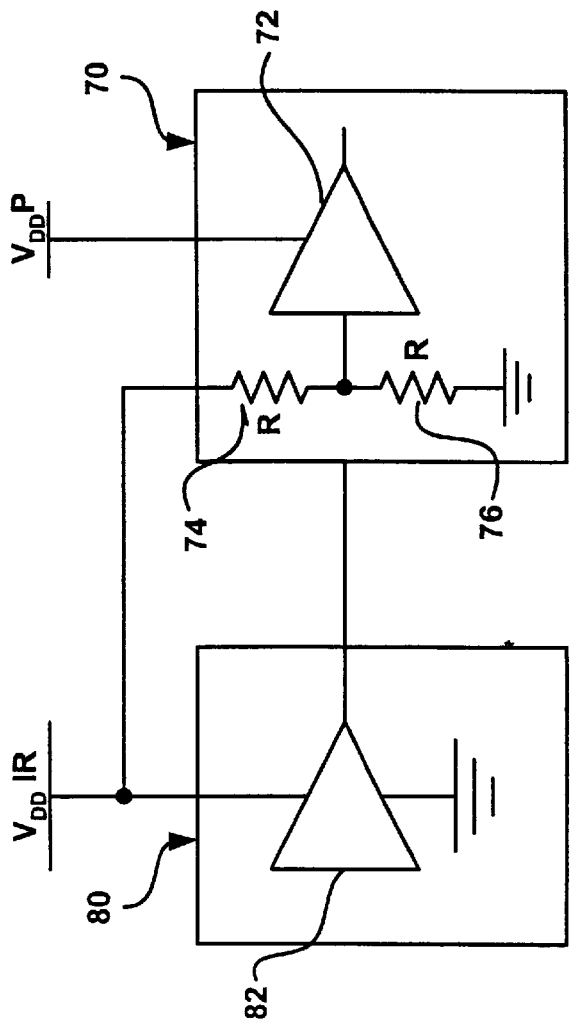
FIG. 3 is a circuit diagram illustrating an example of a conventional level-shifting input receiver circuit configured to receive a signal from an output driver circuit operating using a different power supply voltage level and logic voltage level from that of the receiver circuit.
Figure 4:
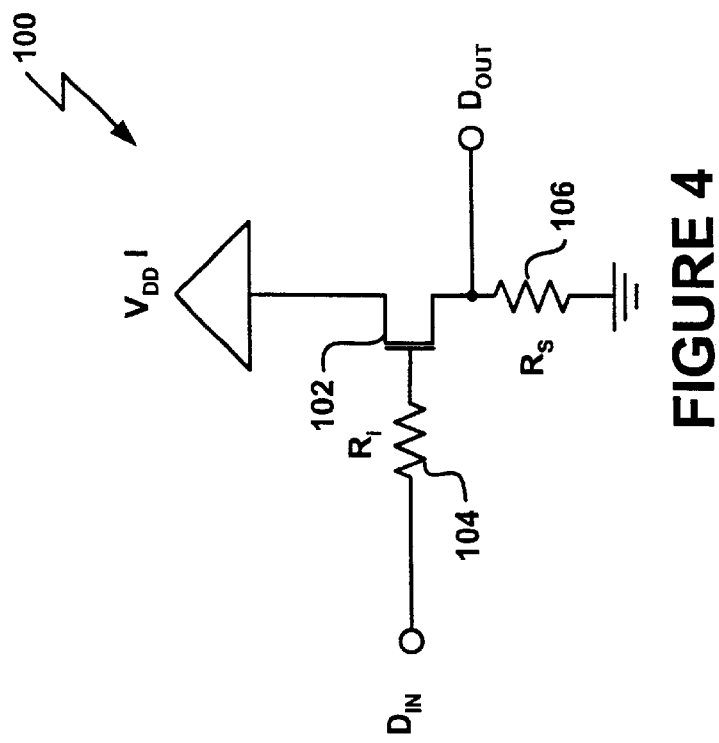
FIG. 4 is a circuit diagram illustrating another example of a conventional level-shifting input receiver circuit configured to receive a signal from an output driver circuit operating using a different power supply voltage level and logic voltage level from that of the receiver circuit.
Figure 5:
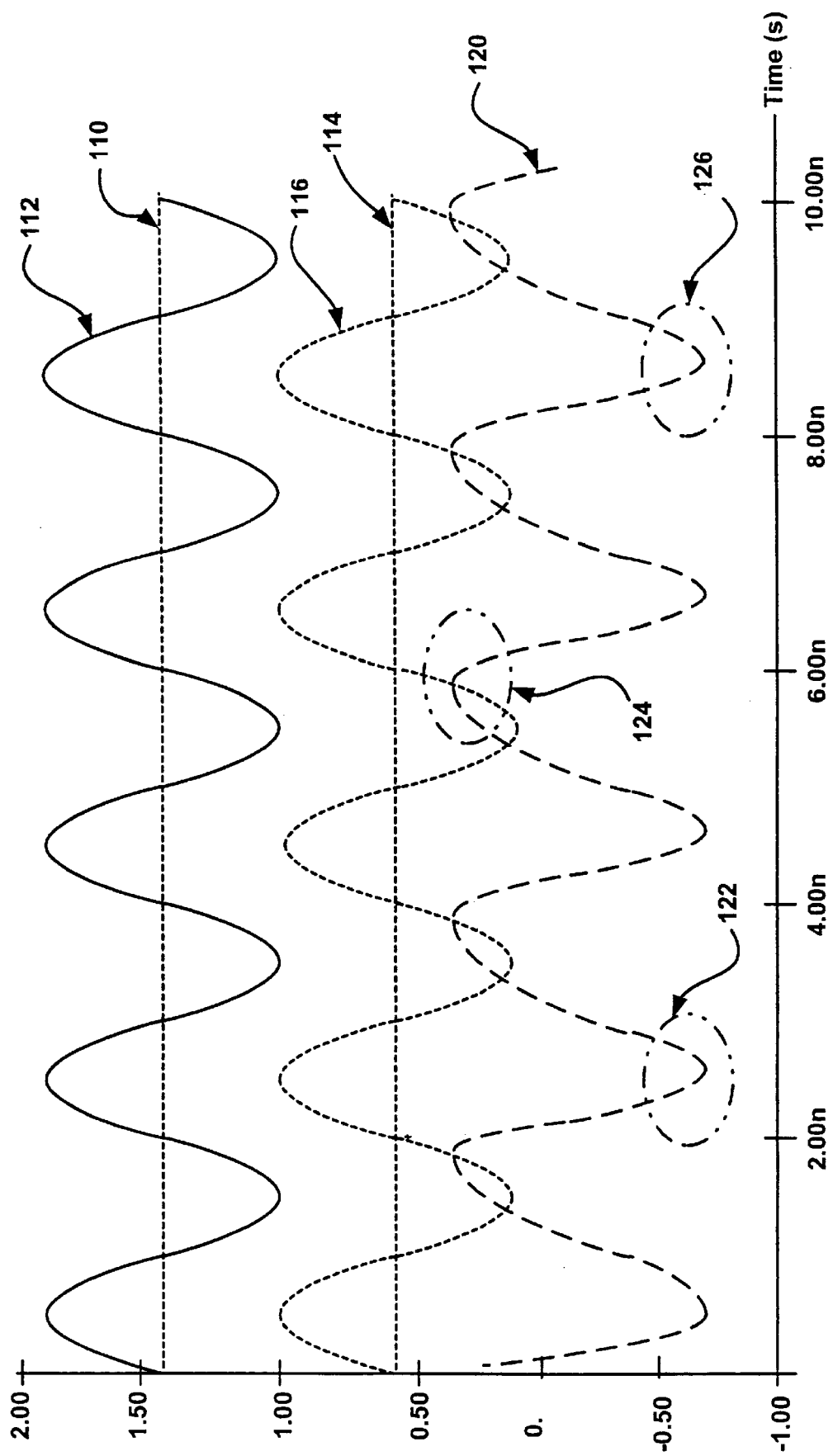
FIG. 5 is a waveform diagram illustrating an input data signal, intermediate circuit node signals, and the distortion that may be introduced to a resulting output signal by a conventional level-shifting input receiver circuit.

As noted above, the logical value of the input signal is determined by comparing the input signal received at input terminal D with the reference voltage applied at terminal $V_{ref}$. The reference voltage applied at $V_{ref}$ may be obtained in a number of ways. For example, the reference voltage may be supplied by a voltage reference generator circuit. The reference voltage may also be derived from $V_{DD}IO$ using a resistive divider network, illustrated as resistors 74 and 76 FIG. 3. For a differential input signal, no reference voltage is required because the logical value of the input signal is obtained by comparison of the input signal received at input terminal D with a complementary input signal received at the other terminal of amplifier 160, where terminal $V_{ref}$ is replaced by a complementary input terminal D* and the complementary input signal replaces the reference voltage. Differential amplifier 160 converts the digital voltage values received at terminals D and $V_{ref}$ into a differential output current signal generated at the inverting and non-inverting output terminals DI and DI* of the amplifier and which appear at circuit nodes OU and OU*.

The "pushing" current sources that drive the output terminals of differential amplifier 160 to generate the differential output current signal combine with the "pulling" current sources 174 and 172 to create a gain stage across the resistive loads 164 and 166. Thus, the differential signal at circuit nodes OU and OU* is amplified before input to complementary latch 170. By making the sizing the pushing device in differential amplifier 160 smaller than the pulling devices in current sources 174 and 172, the pulling sources will ensure that the voltage at gain nodes OU and OU* will not be pushed beyond the internal power supply level at internal power supply $V_{DD}$. Optionally, clamp circuitry may be coupled to circuit gain nodes OU and OU* to further prevent the voltage at the gain nodes from overshooting the internal power supply level.

Figure 7:
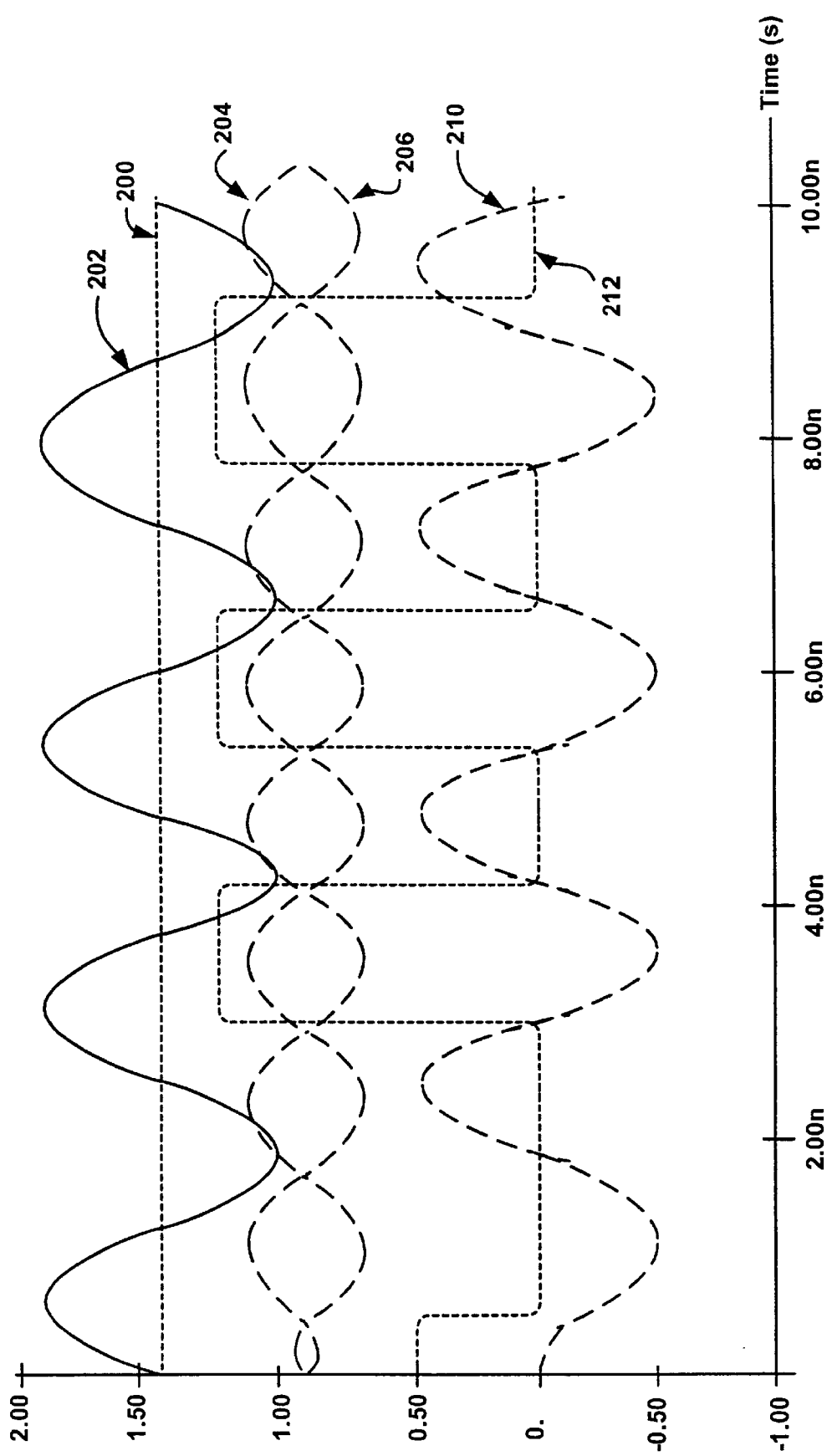
FIG. 7 is a waveform diagram illustrating an example of an input data signal, intermediate circuit gain node signals, and a resulting output signal produced by the level-shifting input receiver circuit of FIG. 6.

FIG. 7 is a waveform diagram illustrating the function of the receiver circuit 150 of FIG. 6. A reference voltage 200 is input at terminal $V_{ref}$ and input data signal 202 is input at terminal D of differential amplifier 160. In this example, $V_{ref}$ is 1.4V and input data signal 202 ranges from 1.0V to 1.8V. Differential amplifier 160 will generate a differential output signal at DI and DI* that appears at gain nodes OU and OU* as waveforms 204 and 206. Waveform 210 represents the difference between the signals at OU and OU*. Note that the differential signal swing of waveform 210 is in the range of 1V peak to peak. The resulting signal output at terminal Q of complementary latch 170 is represented by waveform 212. Note that waveform 212 is delayed from the corresponding input data signal 202 due to propagation delay from the CLK signal driving the latch 170 to the output Q of the latch 170.

The results obtained using the present invention, and illustrated in FIG. 7, may be obtained even when the external voltage level $V_{DD}IO$ is much greater than the internal supply voltage $V_{DD}$. Also, circuit 150, according to the present invention, will operate function satisfactorily even when the internal supply level $V_{DD}$ is less than twice the transistor device threshold voltage ($V_{DD}<2*V_T$), e.g. the circuit may operate with internal supply voltage levels of 1.8V or less without introducing high levels of distortion to the received signal duty cycle.

Figure 8:
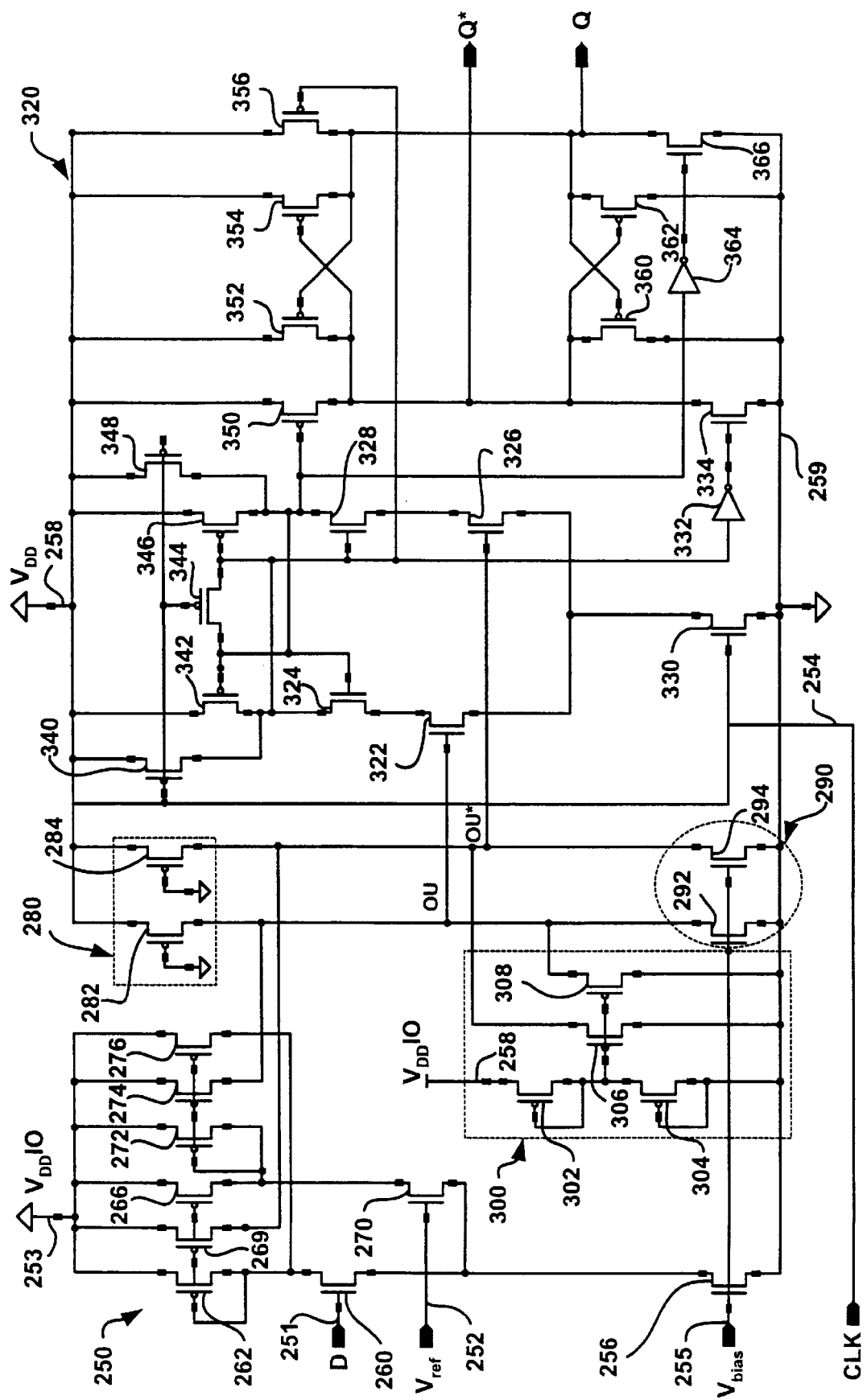
FIG. 8 is a circuit diagram illustrating, at a transistor level, an embodiment of a level-shifting input receiver circuit, according to the present invention, that includes optional clamping circuitry.

FIG. 8 is a circuit diagram showing one embodiment of a receiver circuit 250, according to the present invention, at a transistor level. The received data signal D and reference voltage signal $V_{ref}$ drive a differential input pair of NMOS (N-channel Metal Oxide Semiconductor) transistors 260 and 270. The input data signal D received at data input 251 drives a gate of NMOS transistor 260 while the reference voltage signal $V_{ref}$ received at reference signal terminal 252 drives a gate of NMOS transistor 270. Each of NMOS transistors 260 and 270 have a pair of current terminals, e.g. a source and a drain. The source terminals of NMOS transistors 260 and 270 are coupled to each other and to a drain terminal of current source 256. Current source 256 is implemented as an NMOS transistor 256 whose gate is driven by a bias signal $V_{BIAS}$ received at bias input terminal 255 and whose source is coupled to a ground supply terminal 259 for the circuit 250.

The differential input pair of transistors 260 and 270 differentially share the current drawn by current source 256 as determined by the value of the bias signal $V_{BIAS}$ applied to the bias terminal 255. The current through NMOS transistor 260 is modulated by the input data signal D received at data input terminal 251 and, because the current drawn by current source 256 is constant, the current through NMOS transistor 270 will be complementary to the current through NMOS transistor 260. The resulting current signals developed at the drains of NMOS transistors 260 and 270 is an intermediate differential current signal that reflects the data signal D received at terminal 251.

The intermediate differential current signal generated by NMOS transistors 260 and 270 is reflected through current mirror circuitry that sources current from the external power supply voltage $V_{DD}IO$ applied to external power supply terminal 253. A diode connected, e.g. the gate and drains are connected, PMOS transistor 262 is coupled in series with NMOS transistor 260 and current source 256 between the external power supply terminal 253 and the ground supply terminal 259. The gates of PMOS transistors 264 and 266 are each coupled to the gate of diode connected PMOS transistor 262 and their sources are coupled to the external power supply terminal 253. The drain of PMOS transistor 266 is coupled to the drain of NMOS transistor 270. The drain of PMOS transistor 264 is effectively the inverted output OU* of the input buffer formed by the input differential pair NMOS transistors 260 and 270 and the current mirror pair circuit formed by PMOS transistors 262, 264, 266, 272, 274, and 276.

Another diode connected PMOS transistor 272 is coupled in series with NMOS transistor 270 and current source 256 between the external power supply terminal 253 and the ground supply terminal 259. The gates of PMOS transistors 274 and 276 are each coupled to the gate of diode connected PMOS transistor 272 and their sources are coupled to the external power supply terminal. The drain of PMOS transistor 276 is coupled to the drain of NMOS transistor 260. The drain of PMOS transistor 274 is effectively the non-inverted output of the input buffer formed by the input differential pair NMOS transistors 260 and 270 and the current mirror pair circuit.

A resistive load circuit 280 is coupled in series with a "pulling" current source circuit 290. Resistive load circuit 280 includes PMOS transistors 282 and 284, which each have a source coupled to internal supply terminal 258, which is for receiving internal power supply voltage $V_{DD}$, and a gate coupled to the ground supply terminal. The drain of transistor 282 is coupled to the drain of transistor 274, which is the non-inverted output terminal OU of the input buffer circuit. Similarly, the drain of transistor 284 is coupled to the drain of transistor 264, which is the inverted output terminal OU* of the input buffer circuit. Pulling current source circuit 290 includes NMOS transistors 292 and 294, which each have a source coupled to the ground supply terminal 259 and a gate coupled to the bias terminal 255. The drain of transistor 292 is coupled to the drain of transistor 282 and the drain of transistor 274. Similarly, the drain of transistor 294 is coupled to the drain of transistor 284 and the drain of transistor 264.

PMOS transistors 282 and 284 are configured to operate in their linear range in order to provide a resistive load that is driven by the amplifier formed by the input buffer circuit, formed by input differential pair NMOS transistors 260 and 270 and the current mirror pair circuit formed by PMOS transistors 262, 264, 266, 272, 274, and 276, in combination with the pulling current source circuit 290. Note that PMOS transistors 262, 264, 266, 272, 274, and 276 are "pushing" current sources in receiver circuit 250. By sizing the pushing current sources to be smaller than the pulling current sources 292 and 294, the pulling current sources 292 and 294 will prevent the voltage at the non-inverted output node OU and inverted output node OU* from being driven by the gain stage above the internal power supply voltage $V_{DD}$ applied to internal power supply terminal 258. This also protects the devices, such as those of complementary latch 320, from being pulled to the external power supply voltage level $V_{DD}IO$ during power down of the circuit.

Optionally, a clamp circuit 300 may be provided to further protect against OU and OU* being driven beyond internal power supply voltage $V_{DD}$. In clamp circuit 300, diode connected PMOS transistors 302 and 304 are coupled in series between internal power supply terminal or rail 258 and ground supply terminal or rail. 259. The drain of PMOS transistor 302 is coupled to gates of PMOS transistors 306 and 308. PMOS transistor 306 has a source coupled to the inverting output circuit node OU*, which is also coupled to the drain of PMOS transistor 264, and shunts current from OU* to the ground supply terminal coupled to its source. Similarly, PMOS transistor 308 has a source coupled to the non-inverting output circuit node OU, which is also coupled to the drain of PMOS transistor 274, and shunts current from OU to the ground supply terminal coupled to its source. Clamp circuit 300 operates to prevent OU and OU* from being pulled to the external power supply voltage $V_{DD}IO$, which could cause damage to the internal circuitry driven by the receive circuit 250, such as complementary latch 320.

Receiver circuit 250, in the example illustrated in FIG. 8, drives a complementary latch circuit 320 that operates from the internal power supply voltage $V_{DD}$ applied to internal power supply terminal 258. Latch circuit 320 includes NMOS transistors 322 and 324 connected in series with NMOS transistor 330 and PMOS transistor 342 between internal power supply terminal 258 and ground supply terminal 259. A gate of NMOS transistor 322 is coupled to the drain of PMOS transistor 274, which is the non-inverted output node OU of receiver circuit 250. Latch circuit 320 also includes NMOS transistors 326 and 328 connected in series with NMOS transistor 330 and PMOS transistor 346 between internal power supply terminal 258 and ground supply terminal 259. A gate of NMOS transistor 326 is coupled to the drain of PMOS transistor 264, which is the inverted output node OU* of receiver circuit 250. A gate of PMOS transistor 342 is coupled to the gate of NMOS transistor 324 and a drain of PMOS transistor 346. Similarly, a gate of PMOS transistor 346 is coupled to the gate of NMOS transistor 328 and a drain of PMOS transistor 342. Interposed the gates of PMOS transistors 342 and 346 is PMOS transistor 344, whose gate is driven by the clock signal CLK received at terminal 254. PMOS transistor 340 is coupled between internal power supply terminal 258 and the drain of PMOS transistor 342. PMOS transistor 348 is coupled between internal power supply terminal 258 and the drain of PMOS transistor 346. The gates of both PMOS transistors 340 and 348 are driven by the clock signal CLK received at terminal 254.

The signal present at the gate of NMOS transistor 324, which is one output of a clock sensitive portion of latch 320, drives a gate of PMOS transistor 350 and the signal present at the gate of NMOS transistor 328, which is the other output of the clock sensitive portion of latch 320, drives a gate of PMOS transistor 356. PMOS transistor 350 is coupled in series with NMOS transistor 334, whose gate is driven by the signal present at the gate of NMOS transistor 328 after inversion by inverter 332. PMOS transistor 356 is coupled in series with NMOS transistor 366, whose gate is driven by the signal present at the gate of NMOS transistor 324 after inversion by inverter 364. The drain of NMOS transistor 334 is the output terminal Q* of latch 320 and the drain of NMOS transistor 366 is the output terminal Q of latch 320. A pair of cross-coupled PMOS transistors 352 and 354 along with cross-coupled NMOS transistors 360 and 362 maintain the state of the signal at outputs Q and Q* when the clock signal CLK is inactive.

Complementary latch 320 is a differential device having an input differential pair of NMOS transistors 322 and 326 whose sources are coupled to the drain of NMOS transistor 330, which is controlled by a clock signal CLK received at clock terminal 254. The non-inverting output circuit node OU drives the gate of NMOS transistor 322 while inverting output circuit node OU* drives the gate of NMOS transistor 326. When clock signal CLK is active, then NMOS transistor 330 conducts current that permits the differential current signal present at OU and OU* to change the state of outputs Q and Q* of complementary latch 320.

Note that latch 320 is a conventional latch design included for purposes of demonstrating the interaction of an embodiment of a receiver circuit according to the present invention with conventional circuitry operating from internal supply voltage $V_{DD}$. One of ordinary skill in the art will readily appreciate that many other types of circuits may be employed with the receiver circuit according to the present invention and may benefit from the level-shifting and amplification capabilities of the present invention.

In view of the wide variety of embodiments to which the principles of the present invention can be applied, it should be understood that the illustrated embodiments are exemplary only, and should not be taken as limiting the scope of the present invention. For example, while the circuit above is described as operating using external and internal power supply voltages that are positive with respect to a ground supply, one of ordinary skill in the art will readily recognize that circuits may be designed to operate with external and internal power supply voltages that are negative with respect to a ground supply and that operate according to the teachings of the present invention. Furthermore, other embodiments of the present invention may be developed that employ types of transistors that are different from those discussed above.

The claims should not be read as limited to the described order or elements unless stated to that effect. Therefore, all embodiments that come within the scope and spirit of the following claims and equivalents thereto are claimed as the invention.

What is claimed is:

1. A level-shifting input receiver circuit, the circuit comprising:

a differential amplifier having first and second input terminals, first and second output terminals, and first and second power terminals, where the first input terminal is configured to receive a first input data signal, the second input terminal is configured to receive a second input data signal, and the first power terminal is configured to receive a first power supply voltage;

a first current source having a first power terminal coupled to the second power terminal of the differential amplifier, a second power terminal configured to receive a second power supply voltage, and a control terminal configured to receive a bias control signal;

a first load having a first terminal configured to receive a third power supply voltage and a second terminal coupled to the first output terminal of the differential amplifier;

a second current source having a first power terminal coupled to the first output terminal of the differential amplifier, a second power terminal configured to receive the second power supply voltage, and a control terminal configured to receive the bias control signal;

a second load having a first terminal configured to receive the third power supply voltage and a second terminal coupled to the second output terminal of the differential amplifier; and a third current source having a first power terminal coupled to the second output terminal of the differential amplifier, a second power terminal configured to receive the second power supply voltage, and a control terminal configured to receive the bias control signal.

2. The circuit of claim 1, the circuit further comprising:

a first clamp circuit configured to shunt current between the first output terminal of the differential amplifier and the second power supply voltage; and a second clamp circuit configured to shunt current between the second output terminal of the differential amplifier and the second power supply voltage.

3. The circuit of claim 1, where the differential amplifier further includes:

a first pushing current source configured to direct current from the first power supply voltage to the first output terminal of the differential amplifier; and a second pushing current source configured to direct current from the first power supply voltage to the second output terminal of the differential amplifier;

where the first and second current sources are sized larger than the first and second pushing current sources.

4. The circuit of claim 1, where:

the first load further comprises a first PMOS device having a first current terminal configured to receive the third power supply voltage, a second current terminal coupled to the first output terminal of the differential amplifier, and a control terminal configured to receive the second power supply voltage; and the second load further comprises a second PMOS device having a first current terminal configured to receive the third power supply voltage, a second current terminal coupled to the second output terminal of the differential amplifier, and a control terminal configured to receive the second power supply voltage.

5. The circuit of claim 1, where the differential amplifier further comprises:

a first NMOS transistor having a control terminal coupled to the first input terminal of the differential amplifier, a first current terminal, and a second current terminal coupled to the second power terminal of the differential amplifier;

a second NMOS transistor having a control terminal coupled to the second input terminal of the differential amplifier, a first current terminal, and a second current terminal coupled to the second power terminal of the differential amplifier;

a first PMOS transistor having a first current terminal coupled to the first power terminal of the differential amplifier, a control terminal coupled to a second current terminal, and where the second current terminal is coupled to the first current terminal of the first NMOS transistor;

a second PMOS transistor having a first current terminal coupled to the first power terminal of the differential amplifier, a control terminal coupled to the control terminal of the first PMOS transistor, and a second current terminal coupled to the second output terminal of the differential amplifier;

a third PMOS transistor having a first current terminal coupled to the first power terminal of the differential amplifier, a control terminal coupled to the control terminal of the first PMOS transistor, and a second current terminal coupled to the first current terminal of the second NMOS transistor;

a fourth PMOS transistor having a first current terminal coupled to the first power terminal of the differential amplifier, a control terminal coupled to a second current terminal, where the second current terminal of the fourth PMOS transistor is coupled to the first current terminal of the second NMOS transistor;

a fifth PMOS transistor having a first current terminal coupled to the first power terminal of the differential amplifier, a control terminal coupled to the control terminal of the fourth PMOS transistor, and a second current terminal coupled to the first output terminal of the differential amplifier; and a sixth PMOS transistor having a first current terminal coupled to the first power terminal of the differential amplifier, a control terminal coupled to the control terminal of the fourth PMOS transistor, and a second current terminal coupled to the first current terminal of the first NMOS transistor.

6. The circuit of claim 1, where the second power supply voltage is greater in magnitude than the third power supply voltage.

7. The circuit of claim 1, where the third power supply voltage is less than twice a transistor threshold voltage.

8. The circuit of claim 1, where the second input data signal is complementary to the first input data signal.

9. The circuit of claim 1, where the second input data signal is a reference signal.

10. A method for level-shifting a received signal, the method comprising the steps of:

receiving first and second input signals having voltage levels related to an external power supply voltage;

differentially comparing the first and second input signals to generate a differential current signal, where the differential current signal is sourced from the external power supply voltage;

coupling a resistive load in series with a pulling current source between an internal power supply voltage and a ground supply voltage; and driving the resistive load with the differential current signal.

11. The method of claim 10, the method further including a step of clamping the differential current signal to the ground supply voltage.

12. The method of claim 10, where the step of differentially comparing the first and second input signals further comprises:

driving an NMOS differential pair with the first and second input signals to obtain an intermediate differential current signal; and reflecting the intermediate differential current signal through a PMOS current mirror pair configured to draw current from the, external power supply voltage in order to generate the differential current signal.

13. The method of claim 12, the method further including the step of sizing the pulling current source larger than the PMOS current mirror pair.

14. The method of claim 10, where the step of coupling a resistive load in series with a pulling current source further comprises:

coupling a first PMOS transistor in series with a first pulling current source between the internal power supply voltage and the ground supply voltage;

coupling a second PMOS transistor in series with a second pulling current source between the internal power supply voltage and the ground supply voltage;

configuring the first and second PMOS transistors to operate in a linear range;

driving the first PMOS transistor with a non-inverted portion of the differential current signal; and driving the second PMOS transistor with an inverted portion of the differential current signal.

15. The method of claim 10, the method including a step of configuring the external power supply voltage to be greater than the internal power supply voltage.

16. The method of claim 10, the method including a step of configuring the internal power supply voltage to be less than twice a transistor threshold voltage.

17. The method of claim 10, where the first and second input signals further comprise complementary data signals.

18. The method of claim 10, where the second input signal further comprises a reference voltage configured to differentiate between logic levels of the first input signal.

19. An apparatus for level-shifting a signal, the apparatus comprising:

an external power supply terminal, an internal power supply terminal, a ground supply terminal, first and second input terminals, and a bias input terminal;

first, second and third current sources, each of the first, second and third current sources having first and second current terminals and a control terminal, where each of the first, second and third current sources is configured to conduct current between the first to the second current terminals under control of a signal received at the control terminal, and where the second current terminal of each of the first, second and third current sources is coupled to the ground supply terminal, and further wherein the control terminal of each of the first, second and third current sources is coupled to the bias input terminal;

a differential input buffer having a first input node coupled to the first input terminal, a second input node coupled to the second input terminal, a first power node coupled to the external power supply terminal, a second power node coupled to the first current terminal of the first current source, a first output terminal coupled to the first current terminal of the second current source, and a second output terminal coupled to the first current terminal of the third current source;

a first resistive load coupled between the internal power supply terminal and the first output terminal of the differential input buffer; and a second resistive load coupled between the internal power supply terminal and the second output terminal of the differential input buffer.

20. The apparatus of claim 19, where the differential input buffer further comprises:

a first NMOS transistor having a gate coupled to the first input terminal, a source coupled to the first current terminal of the first current source, and a drain;

a second NMOS transistor having a gate coupled to the second input terminal, a source coupled to the first current terminal of the first current source, and a drain;

a first PMOS transistor having a gate and a drain coupled to the drain of the first NMOS transistor, and a source coupled to the external power supply terminal;

a second PMOS transistor having a gate coupled to the gate of the first PMOS transistor, a source coupled to the external power supply terminal, and a drain coupled to the first output terminal of the differential input buffer;

a third PMOS transistor having a gate coupled to the gate of the first PMOS transistor, and a source coupled to the external power supply terminal, and a drain coupled to the drain of the second NMOS transistor;

a fourth PMOS transistor having a gate and a drain coupled to the drain of the second NMOS transistor, and a source coupled to the external power supply terminal;

a fifth PMOS transistor having a gate coupled to the gate of the fourth PMOS transistor, a source coupled to the external power supply terminal, and a drain coupled to the second output terminal of the differential input buffer; and a sixth PMOS transistor having a gate coupled to the gate of the fourth PMOS transistor, and a source coupled to the external power supply terminal, and a drain coupled to the drain of the first NMOS transistor.

21. The apparatus of claim 19, where each of the first and second resistive loads further comprise a PMOS transistor configured to operate in its linear range.

22. The apparatus of claim 19, the apparatus further including a clamp circuit having a first current terminal coupled to the first output terminal of the differential input buffer and a second current terminal coupled to the second output terminal of the differential input buffer, and a third current terminal coupled to the ground supply terminal, where the clamp circuit is configured to sink current from one of the first and second current terminals of the clamp circuit to the third current terminal of the clamp circuit responsive to the voltage at one of the first and second current terminals of the clamp circuit exceeding a predetermined voltage level.

23. The apparatus of claim 19, where the apparatus is configured to receive a greater voltage at the external power supply voltage terminal than a voltage received at the internal power supply voltage terminal.

24. The apparatus of claim 19, where the apparatus is configured to receive a voltage at the internal power supply voltage terminal that is less than twice a transistor threshold voltage.

25. The apparatus of claim 19, where the first and second input terminals are configured to receive first and second complementary data signals, respectively.

26. The apparatus of claim 19, where the first input terminal is configured to receive a data signal and the second input terminal is configured to receive a reference voltage configured to differentiate between logic levels of the data signal.

27. A method for level-shifting a received signal, the method comprising the steps of:

receiving first and second input signals having voltage levels related to an external power supply voltage;

differentially comparing the first and second input signals to generate a differential current signal, where the differential current signal is sourced from the external power supply voltage by:

driving an NMOS differential pair with the first and second input signals to obtain an intermediate differential current signal; and reflecting the intermediate differential current signal through a PMOS current mirror pair configured to draw current from the external power supply voltage in order to generate the differential current signal;

coupling a resistive load in series with a pulling current source between an internal power supply voltage and a ground supply voltage; and driving the resistive load with the differential current signal.

28. The method of claim 27, where the pulling current source is sized larger than the PMOS current mirror pair.

29. The method of claim 27, where the step of coupling a resistive load in series with a pulling current source further comprises:

coupling a first PMOS transistor of the PMOS current mirror pair in series with a first pulling current source between the internal power supply voltage and the ground supply voltage;

coupling a second PMOS transistor of the PMOS current mirror pair in series with a second pulling current source between the internal power supply voltage and the ground supply voltage;

configuring the first and second PMOS transistors to operate in a linear range;

driving the first PMOS transistor with a non-inverted portion of the differential current signal; and driving the second PMOS transistor with an inverted portion of the differential current signal.

* * * * *